US010133191B2

United States Patent
Tel et al.

(10) Patent No.: US 10,133,191 B2
(45) Date of Patent: Nov. 20, 2018

(54) METHOD FOR DETERMINING A PROCESS WINDOW FOR A LITHOGRAPHIC PROCESS, ASSOCIATED APPARATUSES AND A COMPUTER PROGRAM

(71) Applicant: ASML Netherlands B.V., Veldhoven (NL)

(72) Inventors: Wim Tjibbo Tel, Helmond (NL); Frank Staals, Eindhoven (NL); Paul Christiaan Hinnen, Veldhoven (NL); Reiner Maria Jungblut, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/325,716

(22) PCT Filed: Jul. 15, 2015

(86) PCT No.: PCT/EP2015/066110
§ 371 (c)(1),
(2) Date: Jan. 11, 2017

(87) PCT Pub. No.: WO2016/012316
PCT Pub. Date: Jan. 28, 2016

(65) Prior Publication Data
US 2017/0160648 A1 Jun. 8, 2017

(30) Foreign Application Priority Data
Jul. 21, 2014 (EP) .................................... 14177822

(51) Int. Cl.
*G03B 27/42* (2006.01)
*G03F 7/20* (2006.01)

(52) U.S. Cl.
CPC .......... *G03F 7/70516* (2013.01); *G03F 7/705* (2013.01); *G03F 7/70625* (2013.01); *G03F 7/70633* (2013.01); *G03F 7/70641* (2013.01)

(58) Field of Classification Search
CPC ............. G03F 7/70633; G03F 7/70625; G03F 7/70641; G03F 7/70516; G03F 7/70683;
(Continued)

(56) References Cited

U.S. PATENT DOCUMENTS 7,864,294 B2 1/2011 Wang et al.
8,149,384 B2 4/2012 Chauhan et al.
(Continued)

FOREIGN PATENT DOCUMENTS

EP 1 628 164 2/2006
WO WO 2004/059394 7/2004
(Continued)

OTHER PUBLICATIONS

International Search Report and Written Opinion dated Oct. 23, 2015 in corresponding International Patent Application No. PCT/EP2015/066110.

*Primary Examiner* — Mesfin Asfaw
(74) *Attorney, Agent, or Firm* — Pillsbury Winthrop Shaw Pittman LLP

(57) ABSTRACT

A method of determining a process window for a lithographic process, the process window describing a degree of acceptable variation in at least one processing parameter during the lithographic process. The method includes obtaining a set of output parameter values derived from measurements performed at a plurality of locations on a substrate, following pattern transfer to the substrate using a lithographic process, and obtaining a corresponding set of actual processing parameter values that includes an actual value of a processing parameter of the lithographic process
(Continued)

during the pattern transfer at each of the plurality of locations. The process window is determined from the output parameter values and the actual processing parameter values. This process window may be used to improve the selection of the processing parameter at which a subsequent lithographic process is performed.

20 Claims, 6 Drawing Sheets

(58) Field of Classification Search
CPC .... G03F 7/705; G03F 7/70725; G03F 9/7026; G03F 7/70483; G03F 7/70525; G03F 1/44; G03F 1/70; G03F 2007/2067; G03F 7/70558; G03F 7/70891; G03F 1/36; G03F 7/70433
See application file for complete search history.

(56) References Cited

U.S. PATENT DOCUMENTS

| | | |
|---|---|---|
| 8,703,369 B2 | 4/2014 | Spaziani et al. |
| 9,454,072 B2 | 9/2016 | Kim |
| 2005/0076322 A1* | 4/2005 | Ye .................... G03F 7/705 716/52 |
| 2006/0234136 A1 | 10/2006 | Kim |
| 2007/0031745 A1* | 2/2007 | Ye .................... G03F 7/705 430/30 |
| 2008/0297752 A1 | 12/2008 | Wang et al. |
| 2009/0153818 A1 | 6/2009 | Chauhan et al. |
| 2013/0040230 A1 | 2/2013 | Spaziani et al. |
| 2014/0141536 A1 | 5/2014 | Levinski et al. |

FOREIGN PATENT DOCUMENTS

| | | |
|---|---|---|
| WO | WO 2013/189724 | 12/2013 |
| WO | WO 2014/082938 | 6/2014 |

* cited by examiner

METHOD FOR DETERMINING A PROCESS WINDOW FOR A LITHOGRAPHIC PROCESS, ASSOCIATED APPARATUSES AND A COMPUTER PROGRAM

CROSS-REFERENCE TO RELATED APPLICATIONS

This application is the U.S. national phase entry of PCT patent application no. PCT/EP2015/066110, which was filed on Jul. 15, 2015, which claims the benefit of priority of European patent application no. 14177822, which was filed on Jul. 21, 2014, which is incorporated herein in its entirety by reference.

FIELD

The present invention relates to methods for determining a process window for a lithographic process, and associated apparatuses and a computer program.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate or by writing the pattern into the radiation-sensitive material using a particle beam, e.g. and electron-beam.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology substrate by measuring a part of the pattern and/or by measuring a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a narrow-band radiation beam of substantially monochromatic radiation and measure the intensity of the scattered radiation as a function of angle Under a certain lithographic setting (e.g., lithographic apparatus, wavelength, NA, and so on), the amount of defocus and exposure dose variations that a circuit design can tolerate, while still producing functional chips, is called the design's "process window." The process window is often characterized as an area or region in the two-dimensional Focus Exposure Matrix plot (further also referred to as FEM plot), where "F" represents the focus value or defocus, and "E" represents exposure dose variation. Also other settings of the lithographic apparatus or lithographic tool (e.g., NA) and other processing parameters may have an impact on the process window.

When a layer on a substrate is exposed to a particular Focus and Exposure condition within the process window, that layer on the substrate will most likely be functional (again, apart from local non-systematic defects that may have occurred, such as dust particles locally damaging functionality). When all layers on the substrate are exposed at Focus and Exposure conditions within their respective process windows, the complete dice on the substrate will be functional (apart from non-systematic defects as mentioned before). When a layer on the substrate is exposed to a further particular Focus and Exposure condition outside the process window, that layer and probably all dice on the substrate will not be functional. Incorrect determination of the process window may result a Focus and Exposure condition being used which falls within the incorrectly determined process window (so the layer is expected to be functional), but results in defective dice.

SUMMARY

It is desirable to provide an improved method for determining a process window for a lithographic process.

A first aspect of the invention relates to a method of determining a process window for a lithographic process configured for processing a portion of a design layout onto a substrate, the method comprising the steps of: determining an output parameter value for each structure from a plurality of structures on the substrate, each output parameter value being associated with a corresponding initial processing parameter value at which the lithographic process is set for producing the structure onto the substrate, the structures in the plurality of structures being processed using a range of initial processing parameter values, determining for each of the plurality of structures the actual processing parameter value at which the structure is processed, and determining the process window by replacing the initial processing parameter value by the actual processing parameter value for each of the associated output parameter values and by determining at which actual processing parameter value the output parameter value meets or exceeds a threshold. A second aspect of the invention relates to a method of processing a portion of a design layout onto a substrate using a lithographic process, the method comprising the steps of: determining the process window for the lithographic process according to the first aspect, and selecting a layout processing parameter value for processing the portion of the design layout onto the substrate as being the actual processing parameter value substantially at the center of the determined process window, and/or selecting a further layout processing parameter value for processing the portion of the design layout onto the substrate as being the actual further processing parameter value substantially at the center of the process window. A third aspect of the invention relates to a computer program product comprising instructions for controlling a lithographic processing tool and/or a metrology tool, causing it to perform the method of determining the process window for the lithographic process according to the first aspect. A fourth aspect of the invention relates to a pattern for determining a process window by processing the pattern onto a substrate at a plurality of different initial processing parameter values using a lithographic process, the initial processing parameter value being set at the lithographic process for producing the pattern onto the substrate, the pattern comprising a structure being configured and constructed for having an output parameter value indicative of the quality of the lithographic process, and the pattern further comprising a measurement structure configured and constructed for determining an actual processing parameter value at which the pattern is processed by the lithographic process. A fifth aspect of the invention relates to a lithographic system comprising a lithographic processing tool, a measurement system and a processor, the lithographic processing tool being configured for processing a pattern at a plurality of different initial processing parameter values onto a substrate, the pattern comprising a structure being configured and constructed for having an output parameter value indicative of the quality of the lithographic process, the measurement system being configured for determining for each of the plurality of structures an actual processing parameter value at which the structure is processed by the lithographic processing tool, and a processor for receiving for each of the patterns the initial processing parameter value and the output parameter value, and for receiving the actual processing parameter value from the measurement system, wherein the processor is configured for replacing the initial processing parameter value for each of the patterns by the actual processing parameter value and wherein the processor is further configured for determining the process window by determining at which actual processing parameter value the output parameter value meets or exceeds a threshold. A sixth aspect of the invention relates to a method of calibrating a lithographic model configured for simulating at least a part of a lithographic process for processing a portion of a design layout onto a substrate, the method comprising the steps of: determining an output parameter value for each structure from a plurality of structures on a test-substrate, the test-substrate being processed using the lithographic process and each output parameter value being associated with a corresponding initial processing parameter value at which the lithographic process is set for producing the structure onto the test-substrate, the structures in the plurality of structures being processed using a range of initial processing parameter values, determining for each of the plurality of structures the actual processing parameter value at which the structure is processed, and calibrating the lithographic model by replacing the initial processing parameter value by the actual processing parameter value for each of the associated output parameter values, and by adapting a model parameter of the lithographic model based on the actual processing parameter value and the associated output parameter value of at least some structures from the plurality of structures. A seventh aspect of the invention relates to a computer program product for calibrating the lithographic model according to the sixth aspect. An eighth aspect of the invention relates to a pattern for calibrating a lithographic model configured for simulating at least a part of a lithographic process, the pattern being configured for being processed onto a test-substrate at a plurality of different initial processing parameter values using the lithographic process, the initial processing parameter value being set at the lithographic process for producing the pattern onto the test-substrate, the pattern comprising a structure being configured and constructed for having an output parameter value indicative of the quality of the lithographic process, and the pattern further comprising a measurement structure configured and constructed for determining an actual processing parameter value at which the pattern is processed by the lithographic process.

The method according to the first aspect of the invention comprises the steps of determining an output parameter value for each of the structures from a plurality of structures on the substrate, each output parameter value being associated with a corresponding initial processing parameter value at which the lithographic process is set for producing the structure onto the substrate wherein the structures in the plurality of structures are processed using a range of initial processing parameter values. A next step comprises determining for each of the plurality of structures the actual processing parameter value at which the structure is processed. And finally determining the process window by replacing the initial processing parameter value by the actual processing parameter value for each of the associated output parameter values and by determining at which actual processing parameter value the output parameter value exceeds a threshold. The inventor has realized that the initial processing parameter value may not be the processing value at which a specific exposure has actually taken place on the substrate. Due to, for example, parameter drifts of some of the settings in the lithographic tool, the processing parameter value at which the lithographic process is set for producing the structure onto the substrate may be different compared to the actual processing parameter value. This difference between the initial processing parameter value and the actual processing parameter value may result in errors in determining the overall process window of the lithographic process. As indicated before, using a defective process window during the processing of a design layout onto a substrate may result in defective dice on the substrate. By determining the actual processing parameter value and by replacing the initial processing parameter value by the actual processing parameter value, the correct processing window may be determined, thus improving the determined process window.

As indicated before, in an embodiment, the process window may be defined by a two-dimensional plot, and so next to the initial processing parameter value and the actual processing parameters value, the determination of the process window may also use an initial further processing parameter value and an actual further processing parameter value. For determining the more accurate processing window, the initial further processing parameter value may be replaced by the actual further processing parameter value, similar to the replacing of the initial processing parameter value by the actual processing parameter value. Finally, the process window may be determined by determining at which further processing parameter value the output parameter exceeds the threshold or a further threshold. In such an embodiment, the initial processing parameter value may, for example, be an initial focus value at which the lithographic tool is set for producing the structure onto the substrate. This initial focus value is subsequently replaced by an actual focus value, for example, measured on the substrate. The initial further processing parameter value may, for example, be an initial dose value at which the lithographic tool is set for producing the structure onto the substrate. This initial dose value is subsequently replaced by the actual dose value, for example, measured on the substrate. Using the actual focus value and the actual dose value to determine the overall process window will result in a more accurate determination of the process window.

The output parameter value determined from the structure includes one or more from the list comprising: dimension, critical dimension, sidewall angle, image-log-slope, temperature, pattern placement, overlay, resist height and defectivity. The resist height may, for example, include remaining resist height after development of the structure. The initial processing parameter value and/or the initial further processing parameter value are selected from a list comprising: focus, dose, pattern placement, overlay, laser bandwidth, laser wavelength, aberrations and system dynamics. The system dynamics may, for example, include stage dynamics such as dynamics when positioning the stage in x-direction, y-direction and even z-direction (being substantially parallel to the optical axis of the lithographic system). The initial processing parameter value and/or the initial further processing parameter value are feed forward parameter values set at the lithographic processing tool for performing at least a part of the lithographic process. The actual processing parameter value and/or the actual further processing parameter value comprise actual measurements performed on the substrate comprising the structures produced using the initial processing parameter and/or the initial further processing parameter, respectively. Next to actual measurements performed on the substrate, the actual processing parameter value and/or the actual further processing parameter value may use logged data resulting from previous measurements. Such previous measurements may include measurement on a different substrate, for example, a previously processed substrate from which a drift of the initial processing parameter value set at the lithographic tool is corrected. The measurements may be performed using sensors inside the lithographic processing tool or using metrology tools separate from the lithographic processing tool.

In an embodiment, the initial processing parameter value at a specific location on the substrate and/or the initial further processing parameter value at a specific location on the substrate results from interpolation of a neighboring initial processing parameter value and/or neighboring initial further processing parameter value, respectively. The interpolation may, for example, result from neighboring measured values. In an embodiment, the actual processing parameter value at a specific location on the substrate and/or the actual further processing parameter value at a specific location on the substrate results from interpolation of a neighboring actual processing parameter value and/or neighboring actual further processing parameter value. In an embodiment, each structure in the plurality of structures processed onto the substrate comprises a unique combination of the initial processing parameter value and the initial further processing parameter value. In a further embodiment, the threshold or the further threshold is selected from a list comprising: dimension, critical dimension (further also referred to as CD value), sidewall angle, image-log-slope value (further also referred to as ILS value), temperature, pattern placement, overlay, resist height, resist loss and defectivity. Resist loss may be present as top-loss of the structure which is defined as a situation in which the part of the resist image of the structure is defective at the top of the resist. A structure in which a top-loss in resist is present may result in a poor etch quality when continuing to process such structure using an etch step of the substrate, which may result in a defective structure (e.g. after etch CD change or etching through a line causing an immediate interruption of the line). Alternatively, resist loss may be present as foot-loss in which the resist width at the connection point with the substrate is too narrow (also referred to as footing). Also this will cause changes in etch behavior, similar as indicated before. In addition, the footing may be so severe that the developed line may fall over after development. Identifying such structures may be used to define the edges of the process window.

The method according to the sixth aspect of the invention comprises the steps of determining an output parameter value for each of the structures from a plurality of structures on a test-substrate, the test-substrate being processed using the lithographic process and each output parameter value being associated with a corresponding initial processing parameter value at which the lithographic process is set for producing the structure onto the test-substrate, the structures in the plurality of structures being processed using a range of initial processing parameter values. A next step comprises determining for each of the plurality of structures the actual processing parameter value at which the structure is processed. And finally calibrating the lithographic model by replacing the initial processing parameter value by the actual processing parameter value for each of the associated output parameter values, and by adapting a model parameter of the lithographic model based on the actual processing parameter value and the associated output parameter value of at least some structures from the plurality of structures. As indicated before, the inventor has realized that the initial processing parameter value may not be the processing value at which a specific exposure has actually taken place on the test-substrate. Due to, for example, parameter drifts of some of the settings in the lithographic tool, the processing parameter value at which the lithographic process is set for producing the structure onto the test-substrate may be different compared to the actual processing parameter value. This difference between the initial processing parameter value and the actual processing parameter value may result in errors in calibrating the lithographic model and as such result in errors in the simulated results from such lithographic model. By determining the actual processing parameter value and by replacing the initial processing parameter value by the actual processing parameter value, the correct processing window may be determined, thus improving the determined process window Actual calibration processes used to adapt the model parameter such that the calibrated model more accurately predicts the results of the associated lithographic process may be used, such as . . . [calibration methods].

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
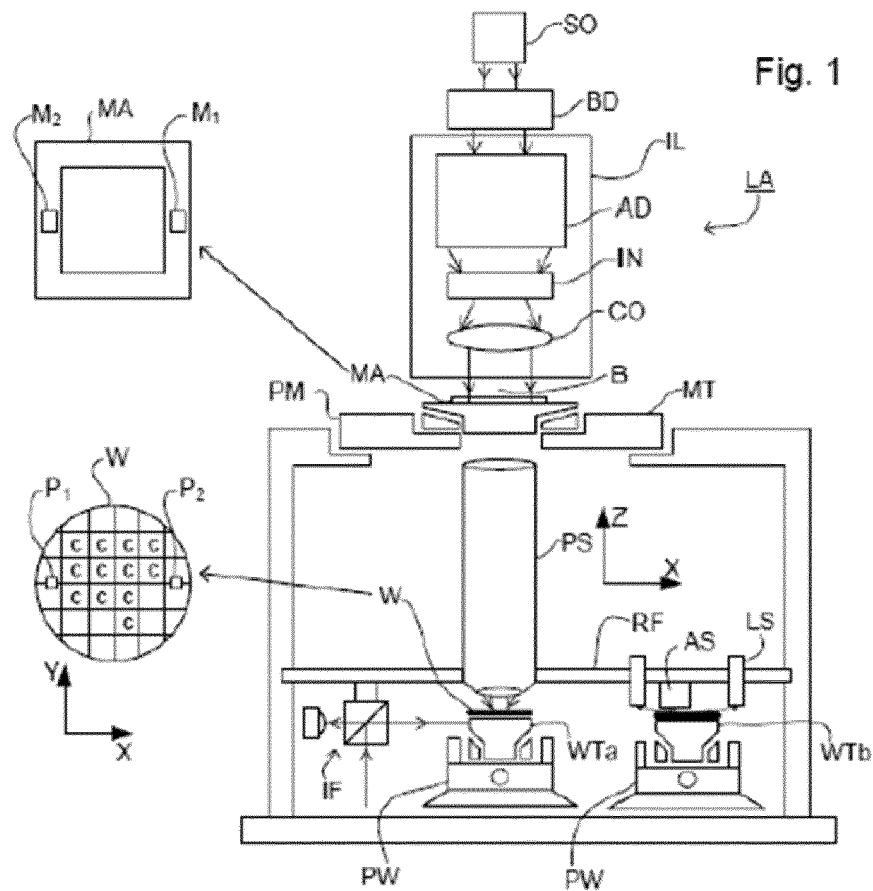
FIG. 1 depicts a lithographic apparatus.

FIG. 1 schematically depicts a lithographic apparatus. The apparatus comprises:
- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
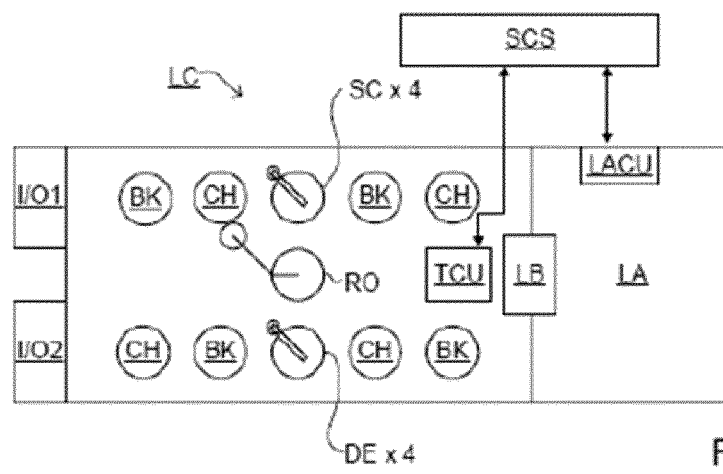
FIG. 2 depicts a lithographic cell or cluster.

As shown in FIG. 2, the lithographic apparatus LA may be used as part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

To ensure that the substrates which are exposed by the lithographic apparatus are exposed correctly and consistently, it is preferred to inspect (at least some of the) exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Thus in a preferred embodiment the lithographic cell also comprises an inspection apparatus or measurement apparatus or measurement tool—for example, an inline inspection tool or inline measurement tool configured for measuring properties immediately after the substrates leave the lithographic apparatus or lithographic tool or, for example, after the substrate leaves a bake plate BK which typically improves the contrast in the latent image. Also, already exposed substrates may be stripped and reworked—to improve yield—or be discarded, thereby avoiding performing exposures on substrates that are known to be faulty. In a case where only some target portions of a substrate are faulty, further exposures may be considered, for example, only on those target portions which are within a predefined specification.

An inspection apparatus or measurement apparatus or measurement system is used to determine the properties and quality of the substrates or structured layers on the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measures properties in the exposed resist layer immediately after the exposure. However, the latent image in the resist has a rather low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to measure the developed resist image—at which point either the exposed or unexposed parts of the resist have been removed—or after a pattern transfer step such as etching. The latter limits the possibilities for rework of faulty substrates but may still provide useful information.

Figure 3:
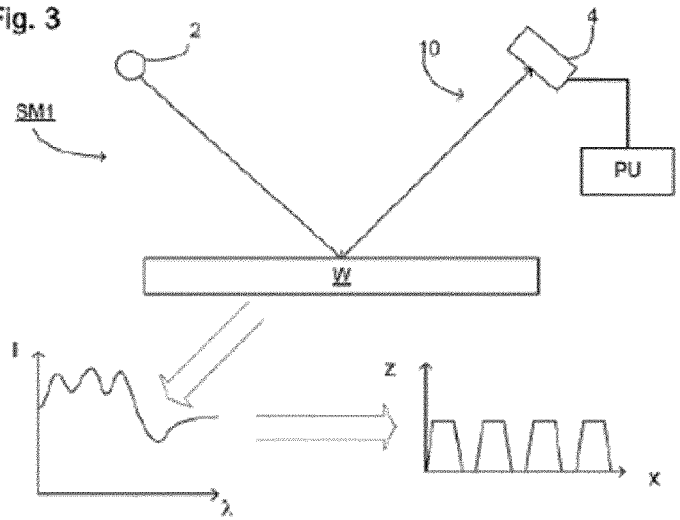
FIG. 3 depicts a first scatterometer.

FIG. 3 depicts a scatterometer which may be used as an inspection apparatus or measurement tool in the present invention. It typically comprises a broadband (white light) radiation projector 2 which projects radiation onto a substrate W. The reflected radiation is passed to a spectrometer detector 4, which measures a spectrum 10 (intensity I as a function of wavelength $\lambda$) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer. Such scatterometer measurements may result in information about the placement of a pattern or structure on the substrate or may be used—preferably when using specific measurement markers—to determine the actual focus value at which the pattern or structure is processed by the lithographic process tool.

Figure 4:
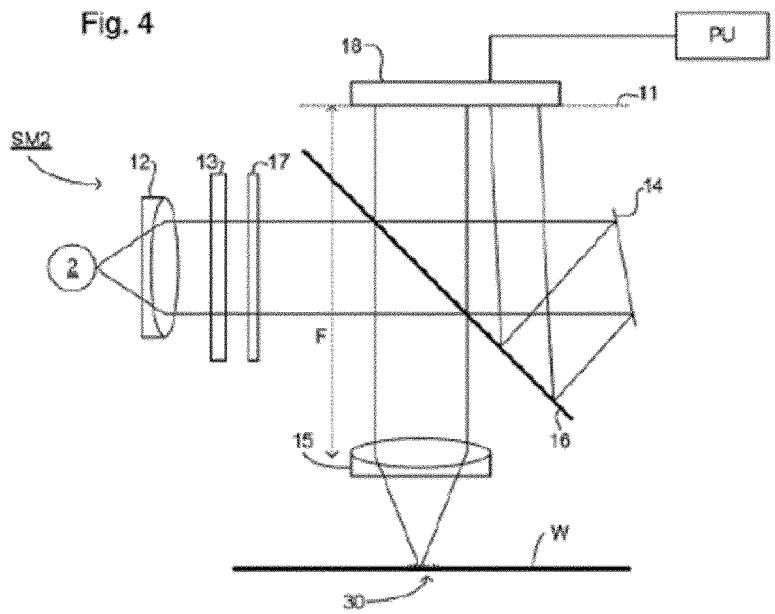
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures more than 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern may, for example, be sensitive to chromatic aberrations in the lithographic projection apparatus. Particularly the projection system PL, and illumination symmetry and the presence of such aberrations will manifest themselves in a variation in the printed grating. The scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target 30 typically is on the surface of the substrate. This target is often constituted of a series of lines constituting a grating or substantially rectangular structures in a 2-D array. From this diffraction spectrum target shape information is extracted, for example, using rigorous optical diffraction theory or using a look-up-table containing pre-calculated diffraction spectra of different target shapes. From this target shape information actual critical dimensions (CD), CD uniformity and placement information of the target (possibly relative to another target) may be derived. Overlay metrology is a measurement methodology in which the overlay of two targets—located in two different layers in the substrate—is measured in order to determine whether the two layers on a substrate are aligned or not. CD uniformity is a measurement indicating how uniform the lithographic processing tool is able to process structure dimensions across the substrate or within a die on the substrate.

When wafers or other substrates are illuminated or printed using a lithographic apparatus, ideally, the light-sensitive layer of the wafer should be placed at the focal plane of the projection optics, or a designated location away from the focal plane. However, the focal plane of today's projection optics is relatively small and many factors influence the position of the light-sensitive layer relative to the focal plane; For example, local substrate-height variations, substrate tilt during exposure and even imperfect mechanical control of lithographic apparatus influences the relative position of the light-sensitive layer relative to the focal plane. So, often there is a small deviation between the position of the focal plane and the actual position of the light-sensitive layer on the substrate. That deviation is called defocus, focus value, or sometimes just called "defocus," and may be represented by a distance unit, typically in a nanometer range, e.g., 50 nm. The defocus values may be local values (e.g. due to substrate-height variations and tilt) which introduces additional imperfections in the imaging path.

Furthermore, to properly develop the structures imaged via the projection optics onto the light-sensitive layer on the substrate, the structures are imaged using a preferred light intensity—also indicated as exposure dose, typically indicated using milliJoule per square centimeter, e.g., 20 mJ/cm$^2$. However, during production the exact exposure dose, even locally, may vary, for example, due to variation in reflectivity of the substrate surface on which the light-sensitive layer is applied, dose variations due to focus variations (as indicated above) and drift in illumination control of the exposure tool. Also the optimal exposure dose to properly develop the structures may vary due to, for example, non-uniformity of the light-sensitive layer and/or, for example, height differences of the light-sensitive layer. So there is always a small deviation between the initial exposure dose as set at the lithographic tool during the exposure step and the actual exposure dose deposited (locally) on a die. This deviation is called exposure dose variation, or sometimes just called "exposure," and may be represented by a percentage deviation from the ideal exposure dose, e.g., 10%.

Due to the variation in processing parameters such as focus and exposure as indicated herein above, the dimensions of the wafer features that are patterned may not match exactly with the dimensions required by the design. Since different structures respond differently to processing parameter value variations such as focus and exposure variations, it is a challenge to describe the response of every individual structure in a circuit pattern with a limited set of parameters. Still, for every individual structure in a layer, an acceptable range of an output parameter values associated with the individual structure, may be defined. Such output parameter may, for example, be the CD or defectivity of the structure. When the individual structure varies within the acceptable range of the output parameter value, the individual structure is not expected to cause the device to be defective. The process window defines a range within which a processing parameter value such as focus and/or dose may vary while the output parameter value of the individual structure remains within the acceptable range. Many processing parameters and output parameters may be used to define a process window. In semiconductor industry the process window is often indicated as a two-dimensional area defined by a first range of acceptable focus values around nominal focus and a second range acceptable of dose value variations around nominal dose, while the output parameter value may, for example, be the CD of the individual structure or the defectivity of the individual structure. Defectivity is a parameter which indicates whether the individual structure is defective, for example, whether a specific structure is no longer intact, or whether the specific structure is not (well) developed or no longer erect (resist structure tipped over after development, e.g. because the resist structure became too narrow due to a too high exposure dose). The lithographic process should be targeted substantially at the center of such a process window to allow sufficient variation in the processing parameters such as focus and exposure dose while avoid to generate a defective device.

One output parameter used to characterize a lithography process is, for example, the width of the smallest features being patterned on a given process layer for a given technology. This minimum dimension is typically referred to as the "critical dimension" or CD. While critical dimensions are actually intended to represent the three dimensional resist profile, the term CD is usually associated with a one-dimensional slice through the resist line, also referred to as the linewidth. In a looser definition, the term CD is often used to refer to the width of the smallest feature for a specific layer of the device or even to any linewidth measurement even if it is not the minimum dimension on the device. In this document the "critical dimension" refers to the smallest feature for a specific layer, unless otherwise explicitly indicated.

A process window for a complete lithographic process may be defined as an overlapping process windows or common process window for all different patterns produced with the lithographic process. Typically the common process window for the complete lithographic process is smaller or equal than the process window of the most critical structure. The reason is that different patterns within a circuit design have different process windows, and that these different process windows may be shifted relative to each other in focus or exposure dose, and changes in the acceptable range of focus and exposure. Different patterns may also have different criteria for successful printing which also define differences in the individual process windows. While CD variation of up to +/−15% may be tolerable for some non-critical features, the tolerance for the most critical structures may be only half as much. The failure modes of different patterns may also be very different. Some patterns may be considered unacceptable due to excessive CD variation, others due to excessive changes in their sidewall profiles, and others may suffer from excessive line end pullback or corner rounding. Catastrophic pattern failures are also possible due to the interaction of neighboring structures. A CD variation that may be acceptable if a given feature were being printed as an isolated structure might cause bridging, necking, or other unacceptable pattern variations in a different local environment.

The definition of the common process window used to this point has been phrased in terms of CD performance or defectivity as the metric of process capability. In fact, the common process window for a viable process must be such that the entire three-dimensional pattern is replicated faithfully, including the sidewall profile and height of the remaining resist pattern after development. A complete, common process window would insure that the CD, sidewall angle (SWA), and resist loss (RL) during development are all within specifications for all structures in the circuit layer being patterned. In practice however, the process window is often defined only in terms of the CD or defectivity. A typical process window may be defined as the region of the Focus-Exposure plane within which the critical dimensions are patterned within the acceptable tolerances, such as +1-10% of the nominal target dimension.

In addition to focus and exposure dose, many other processing parameters may have an adverse impact on the common process window, including, but not limited to, residual lens errors (such as aberrations, light scattering, and other mid- to long-range spatial frequency errors), imperfections in the illumination system of the lithographic tool (such as uniformity, localized partial coherence, and localized variations in pupil filling, and residual errors in the illumination settings), and for example, a quality of the applied optical proximity corrections. As such, the process window or common process window may alternatively be defined using any of these processing parameters mentioned above.

Two methods are often used in semiconductor industry for determining the process window of a lithographic process that is being developed:

Method 1. Generate a plurality of exposures of a specific structure on a substrate (typically distributed over the surface of the substrate) using different focus values and exposure dose values for the individual exposures and thus create a Focus-Exposure Matrix (FEM). Subsequently measure the critical dimensions (CD) of each specific structure at the different focus and exposure dose values and determine the range of focus values and exposure dose values for which the critical dimension of the specific structure remains within the acceptable range of critical dimensions. The process window is defined as the determined focus value range and determined exposure dose range; or Method 2. Expose a similar Focus-Exposure Matrix (FEM) as indicated above, while now, inspecting the specific structures for defects such as pattern integrity and/or non-development of trenches, etc. The edge of the process window may, for example, be defined as the focus values and/or the exposure dose values at which defects start to occur.

As indicated before, focus and dose are common processing parameters used in semiconductor industry. However, any of the processing parameters described in the previous paragraphs might be used to define a process window similar as described above.

FIG. 5 schematically shows the generation of a Focus-Exposure Matrix (FEM) on a substrate 500, for example on a wafer 500. The FEM is constituted of a pattern 510 which is repeatedly imaged onto the wafer 500 at different Focus settings F and different Exposure dose setting ED. The focus settings F are also referred to as initial focus values, and the exposure dose settings are also referred to as initial exposure dose values. The pattern 510 comprises a plurality of structures 530A, 530B from which, for example, the critical dimensions of the structures 530A, 530B may be measured. The structures 530A and 530B as shown in FIG. 5 may be used to measure the critical dimension of the center line at, for example, two locations. When measuring the center line of the structure 530A, 530B at the extended area of the center line, the critical dimension of an "isolated line" may be measured, while when measuring the center line of the structure 530A, 530B at the center of the grating, the critical dimension of a "dense line" may be measured. The pattern 510 shown in the blown-up part of FIG. 5 also contains a focus-measurement structure 540 from which the actual focus value may be measured at which the pattern 510 is actually imaged during the lithographic process. Initially, each imaged pattern 510 on the wafer 500 is associated with the respective initial focus value and initial exposure dose value and the required critical dimension values are measured. From this data, a plot may be generated in which a range of initial focus values and a range of initial exposure dose values within which the measured critical dimension are within an acceptable range, to define an initial process window. However, this plot may not represent the actual process window, as it may contain focus and dose errors. So in the method of generating the process window according to the invention, the actual focus value for each of the imaged patterns 510 on the wafer is measured, for example, using the focus-measurement structure 540. Subsequently, the initial focus values are replaced by the actual focus values for determining the actual process window. This may also be done for the initial exposure dose value which may be replaced by an actual exposure dose value to determine the actual process window. Of course also other structures may be used as focus-measurement structure 540 and the pattern 510 may also include additional measurement structures to measure, for example, the actual exposure dose value, or other relevant local processing parameters.

As an alternative to the measurement of critical dimension to determine the process window as explained herein above, the defectivity of a structure may be used. In FIG. 5 also defects 520 are identified as small dots within a pattern 510. The density of the defects 520 (or the density of the small dots) indicates the quality of the imaging of the pattern 510 at the respective initial focus value and initial exposure dose value. Using a threshold of the number of acceptable defects 520 inside each pattern 510 or using a threshold in which only specific defects may be allowed, the edges of the process window may be determined. By replacing the initial focus value by the actual focus value, similar as explained before, a more accurate indication of the process window is determined. And, next to replacing the initial focus value by the actual focus value, also the initial exposure dose value may be replaced by the actual exposure dose value to further improve the quality of the determined process window.

So in a basic embodiment, the method of determining a process window may comprise:

exposing a pattern 510 onto substrate at a plurality of different processing parameters (for example, at different focus values) and/or at a plurality of different further processing parameters (for example, at different exposure dose values);

measuring the structures 530A, 530B of the pattern 510 on the substrate to obtain a set of output parameter values (for example CD or defectivity) for a plurality of locations on the substrate;

obtaining a set of actual processing parameter values (for example actual focus value) for the same plurality of points on the substrate, such that for each location an output parameter value and a corresponding actual processing parameter value is obtained—said actual processing parameters may be derived from actual measurements on structures exposed on the wafer and/or from data logged by the lithographic apparatus during exposure, as will be explained in greater detail below;

determining said process window from the output parameter values and the actual processing parameter values; and using said determined process window to optimize the processing parameter for a subsequent lithographic process.

With regard to the more specific example of adapting method 1 as has been described above, a proposed method may comprise the following steps:

Expose a Focus-Exposure Matrix (FEM), for various values through focus and exposure dose—this exposure may be performed using a reticle that contains a pattern 510 comprising product features and on-product DBF metrology targets 540;

Optionally, collect actual lithographic apparatus settings during this sequence of exposures to generate the FEM, e.g. substrate levelling data & servo data;

Measure CD (or another output parameter value) for each field;

For each CD measurement location, obtain an actual focus value (or another actual processing parameter value) at that location Plot the measured CD against the actual measured focus value; and Determine the process window from the variation of CD against the actual measured focus value. This may be done based upon a determination as to whether the change in CD exceeds a threshold.

Figure 5A:
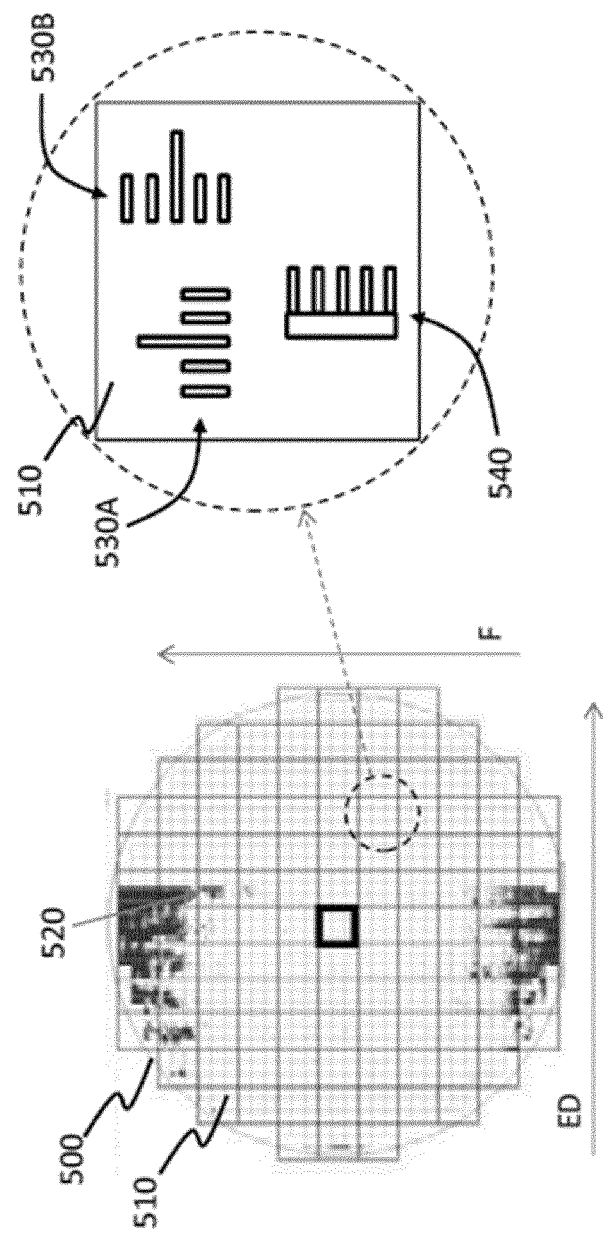
FIG. 5A depicts a wafer exposed according to the Focus-Exposure Matrix test.
Figure 5B:
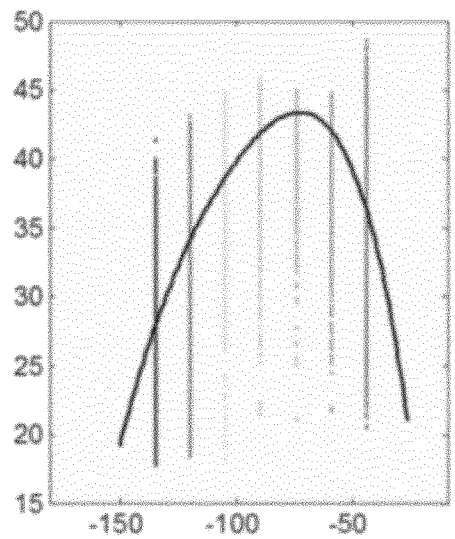
FIGS. 5B and 5C show measurement data for fitting Bossung curves for determining a Best Focus value for a specific imaged structure.
Figure 5C:
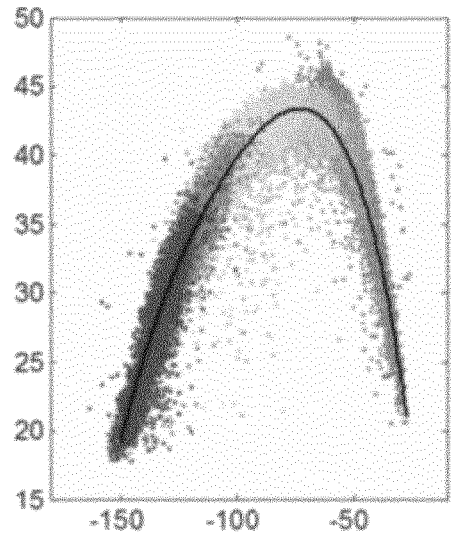
Figure 5D:
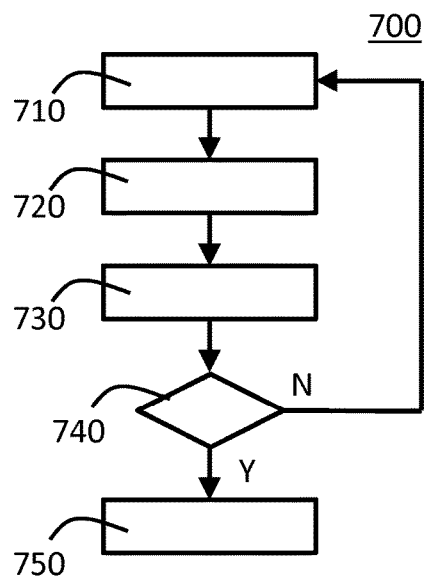
FIG. 5D shows a flow diagram illustrating method steps of improving the fitting of a curve through a set of data.

In an alternative embodiment instead of determining the process window (e.g. as a range of acceptable focus values) the data may be used to determine the actual Best Focus (further also indicated as BF) of a specific structure at a specific exposure dose. To determine the Best Focus, a plot containing the measured CD against the actual measured focus values may be used. In semiconductor industry, the variation of the measured CD value through focus for a specific exposure dose typically follows a second order polynomial function as a trend-line, also known as a "Bossung curve". The Best Focus value for the current process is located at the minimum value (for transparent structures on the mask) or maximum value (for opaque structures on the mask) of the measured CD through focus. Also for such "Bossung curves" by replacing the initial processing parameter value (initial focus value) by the actual processing parameter value (the actual focus value, e.g. measured using a metrology tool) for each of the associated CD values an improved accuracy of the "Bossung curves" is achieved and an improved accuracy of determining Best Focus is achieved. FIG. 5B shows such Bossung curve for an opaque line for which CD is measured on multiple wafers in which the initial set focus values are used. Alternatively the initial set focus values may be replaced by actual measured focus values (not shown) which would result in a more scattered distribution of points along the horizontal axis. To measure the actual focus values, the CD targets used may also have specific targets next to the CD target for locally measuring the focus value as actually occurred during the lithographic processing of these CD targets (not shown). In FIG. 5B the horizontal axis shows the focus value (in nanometers—[nm]) and the vertical axis shows the measured CD (in nanometers—[nm]). Of course, instead of CD, also other output parameters may be used to determine a specific trend-line and instead of varying Focus, also other processing parameters may be used. It will be apparent to the skilled person that this determining of the improved "Bossung curves" using the actual focus measurements instead of the initial set focus measurements may have a wider usage and may be used within and beyond the scope of the current invention, and thus inside and outside the determination of the process window as described in the remainder of this document.

To further improve the quality of the "Bossung curves", also a Shape Invariant Model regression may be applied to the data to reduce systematic process variations that may be present in the data, e.g. from variations in the actual measurements, variations in the performed exposures, etc. Such variations may be seen as 'fingerprints' present in the data. For a single wafer FEM these variations may be intra field fingerprints, and for a multi-wafer FEM the variations may represent all wafer average intra and inter field fingerprints. Such a Shape Invariant Model regression in the specific example of lithographic process control may be implemented by using the following steps which are shown in flow diagram 700 of FIG. 5D:

In step 710, generating a first plot in which all available data (e.g. of multiple wafers and multiple set-points in the lithographic process) of the individual measurements are included. An example of such a plot may be found in FIG. 5B using the initial set focus values;

In step 720, determining a line or trend-line through all available data points to determine the global shape of the trend-line (smooth curved line) representing part of the process. The data points are associated with combinations of processing parameter values, for example, for each data point one actual processing parameter value and one output parameter value (not shown) or for each data point one initial processing parameter value at which the lithographic process is set for producing the structure onto the substrate and one output parameter value (as shown in FIG. 5B). Preferably, the determination of the trend-line should be done while allowing the trend-line to take substantially any shape that fits the data and practically allow a lot of degrees of freedom in the shape fitted through all data. In the embodiment related to Bossung curves, all measured CD data from all wafers for a specific CD target and a specific exposure dose through focus values are used to determine the global shape of the trend-line (using either the actual processing parameter value versus measured CD or the initial processing parameter value versus measured CD—as shown by the smooth line in FIG. 5B);

In step 730, use the determined global shape to determine—and optionally correct for—offset and/or scaling values for individual measurements or for groups of measurements relative to the line or trend-line. Correction would imply actually applying offset and/or scaling related to the determined global shape for individual points or groups of point. An implementation of this step may relate to pattern recognition on the groups of points to find a best fit of the global shape within the groups of points to determine the required offset and/or scaling of the individual points or groups of points.

Furthermore, the method may also be used to prevent artefacts resulting from the particular shape of the Bossung curve. By generating the first plot using all available data, the actual shape of the curve is determined, thus preventing to implement an expected shape onto the data (in the case of Bossung curves, the expected shape may, for example, be a second order polynomial). In particular fitting artefacts through asymmetry of the curve shape around the top, or a measurement range being asymmetrically distributed around the top may be corrected using this method, resulting in an improved accuracy of determining best focus from the Bossung curves.

In an embodiment, the above steps of generating, fitting and correcting may be applied iteratively on the data until a termination condition, checked in step 740, is satisfied. So, as long as the termination condition is not satisfied (indicated in the flow diagram 700 by "N"), the process is iterated by returning to step 710 and using the offset and/or scaling corrected data to generate a new plot of all available offset and/or scaling corrected data and re-fitting a new line or new trend-line through the offset and/or scaling corrected data which again enables the determination of new offset and/or scaling values—etc. The offset and/or scaling to be corrected may be selected from a list including horizontal shift, vertical shift, scaling or a combination of any of these corrections. Alternatively, such offsets and/or scaling may be described by functional deformations of the axis of the plots relative to the data. The termination condition may, for example, be a number of iterations, or, for example, an overall quality of the fit, or, for example, an overall bandwidth of the data, for example, around the trend-line or global fit. If the termination condition is satisfied (indicted in the flow diagram 700 by "Y"), the flow stops at step 750. A result of such iterations according to the flow 700 on the data of FIG. 5B may be found in FIG. 5C in which the overall spread of the data (bandwidth) has been significantly reduced, making the determination of the Best Focus from the improved Bossung curve of FIG. 5C much more accurate. In the embodiment in which the above method is used for determining a Best Focus position of a Bossung curve, the termination condition may be the accuracy (e.g. 3 sigma) of determining the Best Focus value from the data. This applying of or correcting for the offset and/or scaling values reduces the bandwidth of the data-points scattered around the fitted line or trend-line—as can be clearly seen when comparing FIG. 5B with FIG. 5C. As indicated before, this iterative reduction of the process variations in the data points eventually results in a more accurate determination of the actual shape of the trend-line, for example of the actual Bossung curve related to the current process. As a result, the determination of the Best Focus results may be significantly enhanced. Furthermore, it will be apparent to the skilled person that this method of Shape Invariant Model regression using either the initial focus measurements or the actual focus measurements may have a wider usage and may be used within and beyond the scope of the current invention, and thus both inside and outside the determination of the process window as described in the remainder of this document.

As indicated before, offset and/or scaling may be offsets and/or scaling in horizontal and/or vertical direction in the plots. Alternatively, such offsets and/or scaling may be described by functional deformations of the axis of the plots relative to the data.

So in general, the method of improving a fit quality of data comprises the iterative steps of:

determining a trend-line through data points associated with combinations of actual processing parameter values and output parameter values, determining an offset and/or scaling of individual data points or groups of data-points relative to the trend-line, and correcting the individual data-points or groups of data-points using the determined offset and/or scaling, wherein the iterative steps are performed until a termination condition is satisfied. As a result, the quality of the trend-line is significantly improved, but also the offset and/or scaling data (horizontal shift, vertical shift, horizontal scaling, vertical scaling) will be known for each of the sets of data.

In an embodiment the initial trend-line through substantially all data points is used as an initial coarse fit after which the range of data points for the re-fitting is adapted, substantially around the point of interest. Again using the example of the determination of the top of a Bossung curve, the trend-line through all data points used to get a rough indication of the position of the top of the Bossung. At a next step, a specific selection of the data points is done to obtain a second set of data points distributed substantially symmetrically around the determined top of the Bossung after which a re-fitting of the trend-line is performed. This would enhance the quality of the determination of the top of the Bossung curve. Of course, this re-fitting step after selection of the specific selection around the point of interest may be done on any distribution of data, not only Bossung curves.

In an embodiment, the degrees of freedom of the trend-line may be limited before determining the trend-line or during one of the iteration steps of the process. This reduction of the degrees of freedom of the trend-line may prevent local changes of the trend-line due to outliers in the set of data points. In particular, the degree of freedom for the fit per point may be limited toward the value from the trend-line or global fit.

In an embodiment, the re-fitting step may be done using a different selection of the group of data points. This might be a way to identify outliers in the group of data points. If the re-fitting of the trend-line changes significantly when removing a specific data point from the group of data points, this removed specific data point may be an outlier. This process is called Bootstrapping and may be applied to the above mentioned method. Using this bootstrapping would result in the trend-line and fitting algorithm to become less sensitive to outliers and would enhance the overall accuracy of the fitting of the trend-line. And with this also an enhanced accuracy of, for example, the determination of the Best Focus value from a Bossung curve.

Similarly, method 2 as has been described above may also be adapted to comprise the following steps:

Expose a wafer at various values through focus (and/or exposure dose or another processing parameter);

Optionally, collect actual lithographic apparatus settings during sequence of exposures to generate the FEM, e.g. substrate levelling data & servo data;

inspect wafer at a number of measurement locations for defects—defects may be single layer defects (pattern integrity/pattern development related) and/or multiple layer defects (overlay related);

Measure the actual local focus values (or translation, as appropriate) at each measurement location on the substrate;

Define the process window as a range of actual focus values limited by actual focus values at which defects start to occur or reach or exceed a threshold value.

Where the processing parameter is focus, the actual focus values can be obtained for example by:

Performing on-product focus measurements (e.g. via diffraction based focus (DBF) techniques) on the exposed wafer, using (for example) an inspection tool such as those described in this document. This may be achieved by incorporating special features on the reticle (see focus-measurement structure 540 in FIG. 5) which have a relatively large process window, and also have a known sensitivity to focus or dose. Preferably such special feature may be read out, e.g. using an inspection tool. For each output parameter value measurement location, an interpolation from the nearest actual focus value measurement may be made so as to estimate the actual focus value at each of these locations;

Estimation of information obtained from one or more sensors within the lithographic apparatus. Lithographic apparatus may comprise a number of metrology sensors used for (for example) alignment, lens performance, level sensing, servo control. These sensors may be used to estimate the actual focus value at these locations. The focus value estimations may be directly obtained from the metrology sensors or may be determined from logged data obtained when using these sensors during the lithographic exposure operation of the structures.

Each of the focus measurement examples provided above may be used in isolation or in combination. An example of such an embodiment in which the focus measurements are used in combination may comprise the following steps:

Expose a substrate using a reticle comprising product features and on-product metrology targets (e.g. DBF or level verification test (LVT) targets);

Collect actual processing parameter values being actual lithographic apparatus settings during this exposure e.g. substrate levelling data & servo data—these actual processing parameter values are, for example, collected at a relatively fine grid and logged by the lithographic apparatus after exposing the substrate;

Read out exposed wafer e.g. by measuring the on-product DBF targets. This provides information on the absolute on-product focus value on a relatively coarse grid (as there are typically only a limited number of DBF targets, perhaps only between 10 to 30 per exposed field). This measurement step may be performed at a same time when measuring the output parameter value (such as CD);

Use the coarse grid to anchor the relative fine grid of focus value information obtained from the data logged by the lithographic apparatus during exposure. As indicted, the logged data is taken at a relatively fine grid which may be calibrated or anchored using the on-product focus measurements of the DBF targets.

Optionally, height map data (which typically is taken by the lithographic apparatus at an even finer grid) may be combined with the fine grid of data points to even further interpolate between or extrapolate from the data points.

In the above shown embodiment the collected relatively fine grid may also alternatively be measure off-line, for example, in an external metrology tool which is able to measure a topography of a device accurately. This topography measurement may subsequently be combined or calibrated with actual focus measurements, preferably distributed across the surface, for example, distributed across a die. As such, this detailed fine grid from the off-line measurement tool may be used to determine the actual processing parameter for each of the measurement locations while only using a limited number of actual processing parameter values, for example, measured from the substrate.

An alternative example where both defocus measurement examples may be used in combination may comprise the following steps:

Expose a "bare" wafer (i.e. without product structures) using a reticle comprising on-product metrology targets (e.g. DBF and/or LVT targets)

Measure the on-product metrology targets and obtain additional information from the wafer by performing extra measurements of (for example) level sensor errors and product induced wafer flatness—being height information from the wafer without actually measuring the defocus on the wafer structures (using, for example, leveling and servo data during exposure);

From these two steps derive a coarse map of height values from which a coarse focus map may be derived;

Expose product structures and collect actual lithographic apparatus data logged during product exposure e.g. leveling & servo data;

Read out exposed wafer e.g. by CD measurements;

Combine data derived from first the above steps to obtain defocus data on a relatively fine grid.

DBF techniques use focus sensitive structures such as the focus-measurement structure 540 as shown in FIG. 5, possibly arranged in a grating. The shape after development of the focus-measurement structure 540 is dependent upon the focus used during the exposure. The signal of a DBF metrology tool configured to measure these focus-measurement structures 540 is also depending on the shape of these focus-measurement structures and thus on the focus at which the individual focus-measurement structure is imaged. As such, the actual focus at the specific location of the focus-measurement structure on a wafer may be determined. Focus sensitive structures may comprise, for example, high resolution features being features having dimensions near the resolution limit of the lithographic apparatus such that they substantially only print completely at or near the best focus position. Further away from best focus, less of the focus sensitive structures print well. When only a part of the focus sensitive structure comprises these high resolution features, the shape of the focus sensitive structure away from the best focus position will change, which results in an asymmetry of the structure. Consequently, this asymmetry can be measured and correlated to the actual focus value at which the focus sensitive structure is imaged. Such structures are, for example, described in WO2013189724, which is hereby incorporated by reference.

Still, please bear in mind that the above example refers to DBF techniques, but the current invention should not be limited to DBF measurements only.

In one embodiment the process window may be determined by identifying the processing parameter value and/or the further processing parameter value at which a first defect is identified. As a result, the measured focus values and/or the measured exposure dose values of these first identified defects determine the edge of the process window (the threshold being the existence or non-existence of a defect or in other words, a defect count threshold of 1).

In another embodiment, the defect threshold may be determined using a different defect count threshold. The output parameter value may be the number of defects, with the defect thresholds being determined by the first exposed die in the FEM for which this defect count threshold is reached or exceeded. In a further embodiment each output parameter measurement location comprises its own processing parameter measurement structure such that the actual processing parameter value for each output parameter value may be determined.

Figure 6:
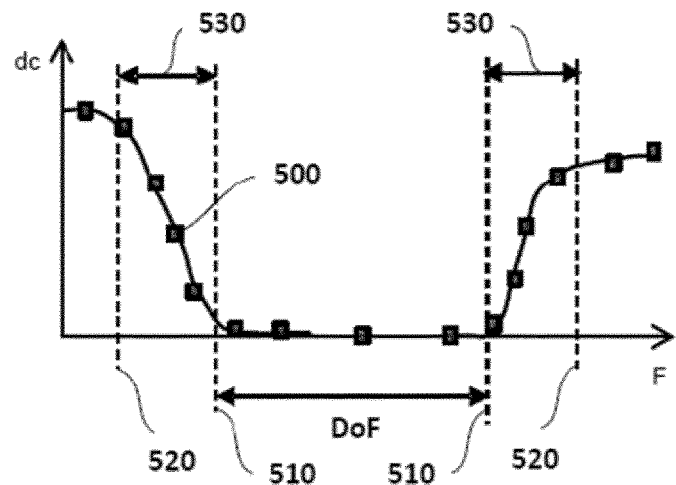
FIG. 6 is a graph depicting a method for determining the depth of focus for a lithographic process in accordance with an embodiment of the invention.

FIG. 6 illustrates how the defect count can be used to determine a DoF using this method. The vertical axis represents the output parameter value being the defect count dc while the horizontal axis represents the processing parameter value being the focus value F, all determined at a single predetermined exposure dose value, for example, the nominal exposure dose value. Each plotted point 500 on the graph represents a count of the defects identified within the measured die exposed at a corresponding initial processing parameter value being the corresponding initial focus value. The defect thresholds (at positive and negative focus values relative to the nominal focus value) 510 may be determined by the measured dies containing a number of defects reaching or exceeding the threshold. The DoF may, for example, be defined as the focus value range between the defect thresholds 510. The horizontal axis representing the focus value range is determined using the actual focus values of the individual defect measurement locations. However, when taking the initial processing parameter value being the initial focus value as set by the lithographic processing tool during the generation of the FEM instead of the actual focus value, this may result in different DoF range. For example, when the DoF range determined using the initial focus values would be between the dashed lines indicated with reference number 520, a broader DoF range would be considered acceptable, probably resulting in higher risk of having defects in the final product. In the current situation, the focus value range indicated with the double-headed arrows indicated with reference sign 530 may only be found by determining the actual focus value and represent the additional risk of determining the processing window with only the initial processing parameter values as done in the known determination methods.

Measuring focus values directly on the product may not always be available to calibrate fine-grid focus information acquired from the lithographic apparatus data logging as proposed before. So where these direct focus measurements are not available, an alternative method of determining defect thresholds may comprise the following steps:

Expose a plurality of wafers in a sequence of different "flat" focus exposures. "Flat" should be understood to mean multiple wafers of a lot, each exposed with a fixed focus offset. Measuring, for example, critical dimensions of structures at corresponding positions on the different wafers (exposed at the different focus settings) may be used to create a kind of "Bossing" curves for this specific position on the wafer from which a Best Focus value for that specific position on the wafer may be determined. Doing this for multiple locations on the wafer may result in a kind of "Best Focus Map" of the wafer which may be used instead of actual on-wafer focus measurements. Such a "Best Focus Map" may also be used to calibrate more dense focus measurements—for example as logged from a wafer leveling system of the lithographic system during exposure of the wafer.

Determine defects (including classification) which determine the boundaries of process window and their location (or, for example, use the critical dimension data which have to remain within a predefined threshold to identify the boundaries of the process window);

Count these defects as a function of location on the wafer for a selected set of fields (similar to standard process window qualification fields); the wafer and its fields exposed at "best focus" are used as defect reference.

Determine DoF based on focus set-values; and

Determine defect threshold at positive and negative defocus as function of the local actual defocus (calculated from lithographic apparatus data).

A disadvantage of the method is that all wafer to wafer variations are averaged out by this "flat" approach. Therefore this method is less accurate than methods applying on-product focus metrology.

It should also be apparent that, using the methods disclosed herein, not only the process window is determined more accurately, but also the determination of the best exposure dose (also often referred to as best energy) and/or the determination of best focus value becomes more accurate. Because the determined best energy and best focus value are typically used as initial processing parameter values for processing an actual product, this improved determination of the best exposure dose and best focus value will have a significant overall improvement to the actual product performance.

The concepts described above may be extended to processing parameters other than focus. For example, the above methods may also be performed to determine the process window in terms of exposure dose, by making an actual estimate/measurement of exposure dose rather than using the initial exposure dose values as set in the lithographic tool during the generation of the FEM. Another example may be to consider edge placement errors within a specific processing layer in multiple patterning processes or edge placement errors between structures imaged on the same substrate in different layers. In such processes, in addition to CD, the overlay error between lithographic steps becomes important.

It is therefore proposed to define an "edge placement window" (further also referred to as EPW) as part of defining the process window. The edge placement window is largely analogous to the DoF ranges described above, but instead of defining a range of usable focus values, it defines a range of acceptable placement and/or exposure dose values. Edge placement errors (EPE) in a patterning process may, for example, depend on a combination of CD uniformity (CDU) and placement errors (Tx, Ty) of layer 1 and CDU and placement errors (Tx, Ty) of layer 2. CD uniformity is a value that describes the variation in critical dimensions within one die, for example, as a result of imaging limitations of the lithographic processing tool, height variations on the wafer within a die, resist non-uniformity, or variations in topography underneath the resist layer. The placement error of a specific layer depends on the exact position determination of the lithographic processing tool relative to a substrate and the ability to position the specific layer at the required position on the substrate.

Such a method may comprise the following steps:

Expose a second layer on top of a first layer on a single substrate, the different dies of the first layer being exposed at nominal processing parameter value settings, and the different dies of the second layer being exposed at predefined offsets in exposure dose (resulting in CD variations) and predefined offsets in die placement (translation/overlay in x and/or y) in a matrix type arrangement. These predefined offsets in exposure dose and placement are the initial processing parameter values at which the second layer is applied relative to the first layer. Of course, instead of exposures at different exposure dose values, the different exposures may also be varied at different focus settings. Such an arrangement may be considered to be a Placement CD Meander, analogous to an FEM, but where the focus value offsets are replaced by translation offsets. Alternatively the first layer and second layer may together form a single lithographic layer in which the first layer, for example forms a first Litho-Etch step (further also indicated as LE step) in a multi-patterning process while the second layer, for example, forms a second LE step in the multi-patterning process. So the layer exposed at nominal settings may be (for example) a fully processed mandrel layer or a first LE (litho-etch) layer that will be the entry for the second LE step (for example, the cut-mask belonging to the mandrel layer), depending on the process.

Inspect all fields for defects, e.g. compare each field to a field with nominal setting and use e.g. electrical inspection to determine the number of defects compared to nominal. Alternatively to electrical inspections, defects may be identified (for example, optically) by identifying the quality of cuts into a mandrel layer or by identifying other kind of defects which may be used to quantify differences in placement of one pattern relative to another (bad connection or too much overlap, etc).

Repeat the above exposure and inspection steps but with the nominal layers and predefined offset layers reversed: expose the first layer with dose/placement offsets to influence the CD/placement of the first layer. Process the first layer and expose a nominal second layer on top of this.

Plot the defect count against translation (in x and/or y) and/or exposure dose value. In a preferred embodiment the translation and/or exposure dose value should be measured or estimated from the substrate rather than plotting against the initial processing parameter values of the Placement CD Meander. However, it should also be appreciated that the determination of an edge placement window from a Placement CD Meander as disclosed is in itself new, even if the set-points are used.

Once the defect window is known in terms of exposure dose value and placement it is also possible to determine the best placement and best exposure dose value by locating the center of the placement process window.

Figure 7:
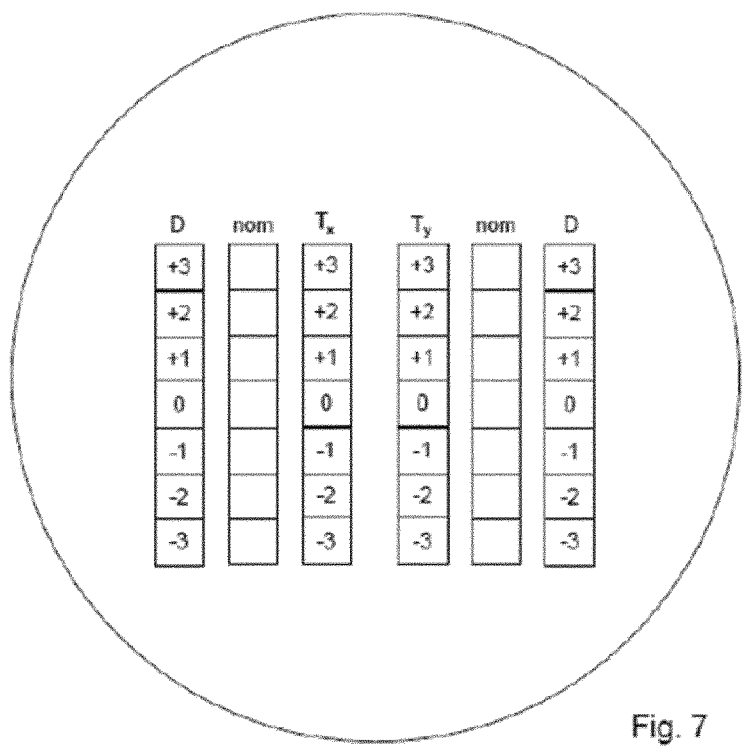
FIG. 7 shows a field layout on a substrate usable in a method according to an embodiment of the invention.

FIG. 7 schematically shows a possible substrate layout in which a plurality of dies (each die indicated with a square) is exposed to determine an edge placement window as described above. In FIG. 7 a first column D comprises a plurality of dies exposed at different exposure dose values D (indicated with the different numbers in each of the dies in the column) relative to the nominal dose value (indicated with the number "0" in the die). A second column 'nom' in which all dies are exposed at nominal exposure dose values and nominal placement as defined by the lithographic tool. This second column 'nom' acts as reference die to the neighboring dies. A third column Tx, Ty comprises a plurality of dies exposed using different predefined displacements in x-direction (Tx) or in y-direction (Ty) (indicated with the different numbers in each of the dies in the column) relative to the nominal placement of the die (indicated with the number "0" in the die).

Figure 8:
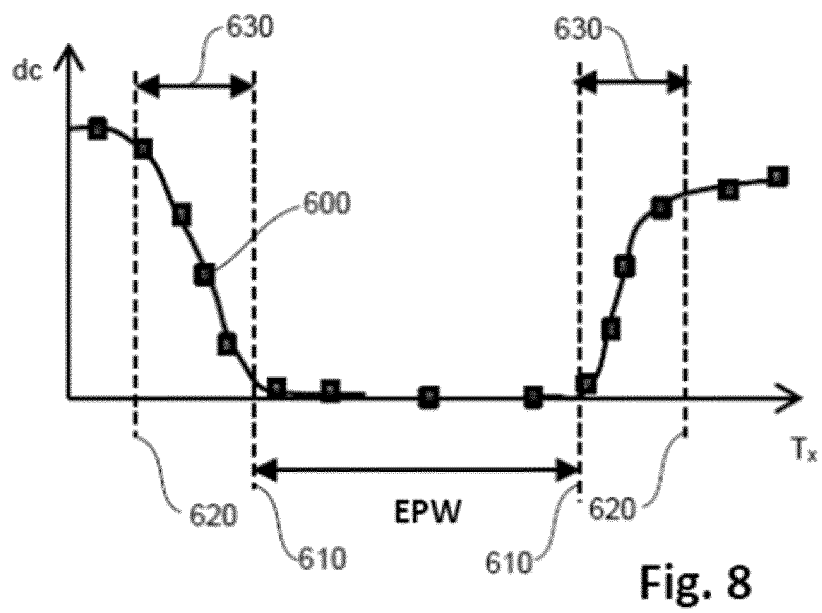
FIG. 8 is a graph depicting a method for determining the edge placement window for a lithographic process in accordance with an embodiment of the invention.

Determination of an EPW and the defect thresholds for translation and dose can be made in a very similar way as determination of the DoF. The defects may be determined as indicated herein above, using electrical measurements or, for example, optical methods to, for example, determine a level of overlap between structures, or any other way of quantifying defects. This is illustrated by FIG. 8. The vertical axis represents the output parameter value being the defect count dc while the horizontal axis represents the processing parameter value being the translation in x-direction $T_x$. Similar graphs may be plotted for, for example, translation in the y-direction $T_y$, CD and/or exposure dose. Each plotted point 600 on the graph represents a count of the defects identified within the measured die exposed at a corresponding initial processing parameter value being the corresponding initial translation value in x-direction. The defect thresholds (at positive and negative translation values relative to the nominal position value) 610 may be determined by the measured dies containing a number of defects reaching or exceeding the threshold. The EPW may, for example, be defined as the translation or displacement value range between the defect thresholds 610. The horizontal axis representing the translation value range is determined using the actual translation values of the individual defect measurement locations. However, when taking the initial processing parameter value being the initial translation or displacement value as set by the lithographic processing tool during the generation of the matrix instead of the actual translation or displacement value, this may result in different EPW range. For example, the EPW range determined using the initial translation values may, for example, be between the dashed lines indicated with reference number 620, which would result in a broader EPW range and would, for example, result in a higher risk of having defects in the final product. In the current situation, the translation value range indicated with the double-headed arrows indicated with reference sign 630 may only be found when using the actual translation or displacement value rather than the initial translation or displacement values, and represent the additional risk of determining the processing window with only the initial processing parameter values.

It has to be noted that the examples shown in FIGS. 6 and 8 indicate that the DoF or the EPW will decrease when using the actual processing parameter rather than the initial processing parameter, for example, as set at the lithographic tool during the exposure of the structures on the substrate. However, the DoF or EPW using the actual processing parameters may change in many different ways, depending on the difference between the actual processing parameter and the initial processing parameters. This difference between the actual processing parameter and the initial processing parameter may be due to calibration errors, residual optical errors or temporal drift of calibration settings in the tools.

Figure 9:
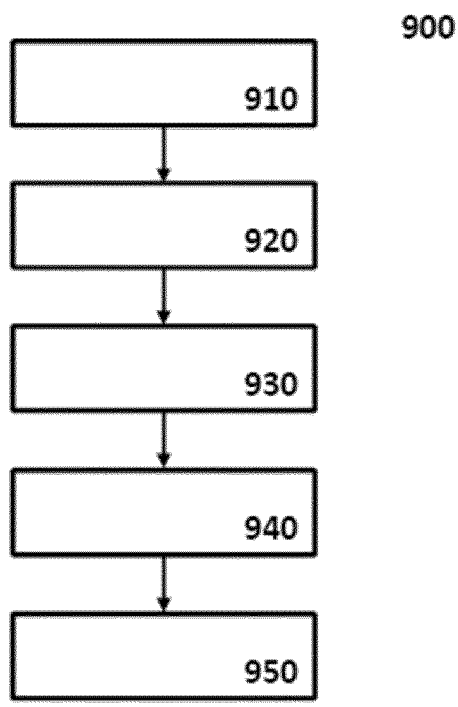
FIG. 9 shows a flow diagram illustrating the method steps according to an embodiment of the invention.

FIG. 9 schematically shows a flow-diagram 900 indicating some of the steps in the method of determining the process window according to the current embodiments. Step 910 "expose structures on substrate" indicates that step of exposing structures at different processing parameters onto a substrate such as a wafer. Typically this is done using a lithographic exposure tool which exposes a plurality of dies on a single substrate in which the different dies are exposed at different processing parameter values. A typical example of such exposed substrate is a Focus-Exposure Matrix, in which a matrix of dies are exposed on a wafer, in which substantially each die has a unique combination of initial focus value settings of the lithographic exposure tool and of initial exposure dose value settings of the lithographic exposure tool. Again, the initial exposure dose value represents a feed-forward set exposure dose value as set at the exposure tool, and the initial focus value setting represents a feed-forward focus value as set at the exposure tool. Due to, for example, tool drifts these initial exposure dose values and initial focus values may deviate from the actual exposure dose values and actual focus values at which the specific die is actually processed on the wafer. Next, step 920 "determine output parameter" the output parameter is determined. As indicated before, this output parameter may, for example, be a critical dimension value which should remain within an acceptable range. Alternatively other output parameter values, such as defectivity of the structure may be used. Subsequently, in step 930 "associate the output parameter with the initial processing parameter", an association is made between the output parameter and the processing parameters at which the specific output parameter is processed. Step 940 "determine actual processing parameters" indicates the determination of the actual processing parameter for each of the processed dies. Typically some measurements on the substrate may be used to determine the actual processing parameter. For example, local measurements of the actual focus value at which the die is actually processed may be done to determine the actual focus value. Next to actual measurements, also exposure data collected during the exposure of the dies may be used—possibly in addition to the direct measurements—to determine the local actual processing parameters. For example, leveling measurements at the lithographic tool or wafer un-flatness measurements performed in the lithographic tool may be used—possibly together with local measurements—to define the actual focus value at each point within a die. Next, step 950 "replacing the initial processing parameter value with the actual processing parameter value" the initial processing parameter value is replaced by the actual processing parameter value. Finally, in step 960 "determine process window" the actual process window is determined by determining at which actual processing parameter value the output parameter value meets or exceeds a threshold. Using the actual processing parameter values to determine the process window results in a more accurate determination of the process window resulting in a more reliable overall process.

In an alternative embodiment, the use of the actual processing parameter value may also be used to calibrate a lithographic model which may, for example, be configured for simulating at least a part of the lithographic process for processing a portion of a design layout onto a substrate. Such lithographic model typically consists of a number of parameters, the values of which are calibrated according to empirical data. The calibration process is one in which the parameters of the model are determined to minimize a difference between simulated images based on the model and the measured images, for example measured at certain sampling points or gauges. The calibration typically consists of data weighing selection and fitting algorithms.

Such alternative embodiment in which the actual processing parameter value is used for lithographic model calibration also may be schematically shown in the flow diagram 900 of FIG. 9. This flow-diagram 900 indicates some of the steps in the method of calibrating a lithographic model according to the current embodiment. In such an alternative embodiment, Step 910 "expose structures on substrate" indicates that step of exposing structures at different processing parameters onto a substrate such as a wafer. Typically this is done using a lithographic exposure tool which exposes a plurality of dies on a single substrate in which the different dies are exposed at different processing parameter values. Subsequently these exposed dies may be measured and these measurements may be used as the empirical data used for calibrating the lithographic model. A typical example of such exposed substrate is a Focus-Exposure Matrix, in which a matrix of dies are exposed on a wafer, in which substantially each die has a unique combination of initial focus value settings of the lithographic exposure tool and of initial exposure dose value settings of the lithographic exposure tool. Again, the initial exposure dose value represents a feed-forward set exposure dose value as set at the exposure tool, and the initial focus value setting represents a feed-forward focus value as set at the exposure tool. Due to, for example, tool drifts these initial exposure dose values and initial focus values may deviate from the actual exposure dose values and actual focus values at which the specific die is actually processed on the wafer. Next, step 920 "determine output parameter" the output parameter is determined. As indicated before, this output parameter may, for example, be a critical dimension value which should remain within an acceptable range. Alternatively other output parameter values, such as defectivity of the structure may be used. Subsequently, in step 930 "associate the output parameter with the initial processing parameter", an association is made between the output parameter and the processing parameters at which the specific output parameter is processed. Step 940 "determine actual processing parameters" indicates the determination of the actual processing parameter for each of the processed dies. Typically some measurements on the substrate may be used to determine the actual processing parameter. For example, local measurements of the actual focus value at which the die is actually processed may be done to determine the actual focus value. Next to actual measurements, also exposure data collected during the exposure of the dies may be used—possibly in addition to the direct measurements—to determine the local actual processing parameters. For example, leveling measurements at the lithographic tool or wafer un-flatness measurements performed in the lithographic tool may be used—possibly together with local measurements—to define the actual focus value at each point within a die. Next, step 950 "replacing the initial processing parameter value with the actual processing parameter value" the initial processing parameter value is replaced by the actual processing parameter value. This combination of output parameters with the actual processing parameters may be used as part of the empirical data for calibrating the lithographic model. Finally, in step 960 "calibrate lithographic mode" the actual calibration process is performed in which fitting algorithms are used to determine the model parameters for which a difference between the simulated output parameter and the measured output parameter is minimized. Using the actual processing parameter values for this calibration process significantly improves the overall lithographic model quality and improves the overall prediction quality of the lithographic mode.

So as a summary, the embodiments disclosed herein provide a method of determining a process window for a lithographic process, the process window describing a degree of acceptable variation in at least one processing parameter during the lithographic process. The method comprises obtaining a set of output parameter values derived from measurements performed at a plurality of locations on a substrate, following exposure of the substrate using a lithographic process, and a corresponding set of actual processing parameter values comprising the actual value of a processing parameter of the lithographic process during the exposure at each of the plurality of locations. The process window is determined from the output parameter values and the actual processing parameter values. This process window may be used to improve the selection of the processing parameter at which a subsequent lithographic process is performed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. . . . . The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The invention may further be described using the following clauses:

1. A method of determining a process window for a lithographic process configured for processing a portion of a design layout onto a substrate, the method comprising the steps of:

determining an output parameter value for each structure from a plurality of structures on the substrate, each output parameter value being associated with a corresponding initial processing parameter value at which the lithographic process is set for producing the structure onto the substrate, the structures in the plurality of structures being processed using a range of initial processing parameter values, determining for each of the plurality of structures the actual processing parameter value at which the structure is processed, and determining the process window by replacing the initial processing parameter value by the actual processing parameter value for each of the associated output parameter values and by determining at which actual processing parameter value the output parameter value meets or exceeds a threshold.

2. The method of clause 1, wherein the output parameter value determined from the structure includes one or more from the list comprising: dimension, critical dimension, sidewall angle, image-log-slope, temperature, pattern placement, overlay, resist height and defectivity.

3. The method of clause 1 or 2, wherein the method further comprises a step of:

associating each output parameter value with a corresponding initial further processing parameter value at which the lithographic process is set for producing the structure onto the substrate, the initial further processing parameter value being a different parameter compared to the initial processing parameter value, determining for each of the plurality of structures the actual further processing parameter value at which the structure is processed, and wherein the step of determining the process window further comprises replacing the initial further processing parameter value by the actual further processing parameter value and further comprises determining at which actual further processing parameter value the output parameter value meets or exceeds the threshold or a further threshold.

4. The method of clause 3, wherein the initial processing parameter value and the initial further processing parameter value are independent parameter values of the lithographic process.

5. The method of any of the clauses 1 to 4, wherein the initial processing parameter value and/or the initial further processing parameter value are selected from a list comprising: focus, dose, pattern placement, overlay, laser bandwidth, laser wavelength, aberrations and system dynamics.

6. The method of any of the previous clauses, wherein the initial processing parameter value and/or the initial further processing parameter value are feed forward parameter values set at a lithographic processing tool for performing at least a part of the lithographic process, and wherein the actual processing parameter value and/or the actual further processing parameter value are measured parameter values comprising actual measurements performed on the substrate comprising the structures produced using the initial processing parameter and/or the initial further processing parameter, respectively.

7. The method of clause 6, wherein the actual processing parameter value and/or the actual further processing parameter value are determined using the actual measurements and/or using logged data resulting from previous measurements.

8. The method of clause 6, wherein measurement of the actual processing parameter value and/or of the actual further processing parameter value are performed by the lithographic processing tool, or wherein measurement of the actual processing parameter value and/or the actual further processing parameter value are measured by a metrology tool separate from the lithographic processing tool.

9. The method of clause 6, wherein the initial processing parameter value at a specific location on the substrate results from interpolation of a neighboring initial processing parameter value and/or wherein the initial further processing parameter value at a specific location on the substrate results from interpolation of a neighboring initial further processing parameter value, and/or wherein the actual processing parameter at the specific location on the substrate results from interpolation of a neighboring actual processing parameter value and/or wherein the actual further processing parameter at the specific location on the substrate results from interpolation of a neighboring actual further processing parameter value.

10. The method of any of the previous clauses, wherein each structure in the plurality of structures comprises a measurement structure for measuring the actual processing parameter value and/or for measuring the actual further processing parameter value.

11. The method of any of the previous clauses, wherein each structure in the plurality of structures comprises a unique combination of the initial process parameter value and the initial further process parameter value.

12. The method of any of the previous clauses, wherein the threshold and/or the further threshold is selected from a list comprising: dimension, critical dimension, sidewall angle, image-log-slope, temperature, pattern placement, overlay, resist height, resist loss and defectivity.

13. The method of any of the previous clauses, wherein the initial processing parameter value set at the lithographic processing tool for processing a current substrate is calibrated using the actual processing parameter value measured from a previously processed substrate, and/or wherein the initial further processing parameter value set at the lithographic processing tool for processing the current substrate is calibrated using the actual further processing parameter value measured from the previously processed substrate.

14. A method of processing a portion of a design layout onto a substrate using the lithographic process, the method comprising the steps of:

determining the process window for the lithographic process according to any of the clauses 1 to 13, and selecting a layout processing parameter value for processing the portion of the design layout onto the substrate as being the actual processing parameter value substantially at the center of the determined process window, and/or selecting a further layout processing parameter value for processing the portion of the design layout onto the substrate as being the actual further processing parameter value substantially at the center of the process window.

15. A computer program product comprising instructions for controlling a lithographic processing tool and/or a metrology tool, causing it to perform the method of determining the process window for the lithographic process according to any of the clauses 1 to 13.

16. A pattern for determining a process window by processing the pattern onto a substrate at a plurality of different initial processing parameter values using a lithographic process, the initial processing parameter value being set at the lithographic process for producing the pattern onto the substrate, the pattern comprising a structure being configured and constructed for having an output parameter value indicative of the quality of the lithographic process, and the pattern further comprising a measurement structure configured and constructed for determining an actual processing parameter value at which the pattern is processed by the lithographic process.

17. A lithographic system comprising a lithographic processing tool, a measurement system and a processor,
the lithographic processing tool being configured for processing a pattern at a plurality of different initial processing parameter values onto a substrate, the pattern comprising a structure being configured and constructed for having an output parameter value indicative of the quality of the lithographic process,
the measurement system being configured for determining for each of the plurality of structures an actual processing parameter value at which the structure is processed by the lithographic processing tool, and
a processor for receiving for each of the patterns the initial processing parameter value and the output parameter value, and for receiving the actual processing parameter value from the measurement system, wherein the processor is configured for replacing the initial processing parameter value for each of the patterns by the actual processing parameter value and wherein the processor is further configured for determining the process window by determining at which actual processing parameter value the output parameter value meets or exceeds a threshold.

18. The lithographic system according to clause 17, wherein the measurement system is further configured for determining the output parameter value for each of the patterns.

19. The lithographic system according to clause 17, wherein the pattern comprises a measurement structure, the measurement system being configured and constructed for determining an actual processing parameter value at which the pattern is processed by the lithographic process from the measurement structure.

20. The lithographic system according to clause 17, wherein the lithographic processing tool comprises the measurement system and/or the processor.

21. The lithographic system according to clause 17, wherein the measurement system comprises a diffraction based measurement system.

22. A method of calibrating a lithographic model configured for simulating at least a part of a lithographic process for processing a portion of a design layout onto a substrate, the method comprising the steps of:
determining an output parameter value for each structure from a plurality of structures on a test-substrate, the test-substrate being processed using the lithographic process and each output parameter value being associated with a corresponding initial processing parameter value at which the lithographic process is set for producing the structure onto the test-substrate, the structures in the plurality of structures being processed using a range of initial processing parameter values,
  determining for each of the plurality of structures the actual processing parameter value at which the structure is processed, and
  calibrating the lithographic model by replacing the initial processing parameter value by the actual processing parameter value for each of the associated output parameter values, and by adapting a model parameter of the lithographic model based on the actual processing parameter value and the associated output parameter value of at least some structures from the plurality of structures.

23. The method of clause 22, wherein the output parameter value determined from the structure includes one or more from the list comprising: dimension, critical dimension, sidewall angle, image-log-slope, temperature, pattern placement, overlay, resist height and defectivity.

24. The method of clause 22 or 23, wherein the method further comprises a step of:
  associating each output parameter value with a corresponding initial further processing parameter value at which the lithographic process is set for producing the structure onto the test-substrate, the initial further processing parameter value being a different parameter compared to the initial processing parameter value,
  determining for each of the plurality of structures the actual further processing parameter value at which the structure is processed, and
  wherein the step of calibrating the lithographic model further comprises replacing the initial further processing parameter value by the actual further processing parameter value, and further comprises adapting a further model parameter of the lithographic model based on the actual further processing parameter value and the associated output parameter value of at least some structures from the plurality of structures.

25. The method of clause 24, wherein the initial processing parameter value and the initial further processing parameter value are independent parameter values of the lithographic process.

26. The method of any of the clauses 22 to 25, wherein the initial processing parameter value and/or the initial further processing parameter value are selected from a list comprising: focus, dose, pattern placement, overlay, laser bandwidth, laser wavelength, aberrations and system dynamics.

27. The method of any of the clauses 22 to 26, wherein the initial processing parameter value and/or the initial further processing parameter value are feed forward parameter values set at a lithographic processing tool for performing at least a part of the lithographic process, and wherein the actual processing parameter value and/or the actual further processing parameter value are measured parameter values comprising actual measurements performed on the test-substrate comprising the structures produced using the initial processing parameter and/or the initial further processing parameter, respectively.

28. The method of clause 27, wherein the actual processing parameter value and/or the actual further processing parameter value are determined using the actual measurements and using logged data resulting from previous measurements.

29. The method of clause 27, wherein measurement of the actual processing parameter value and/or of the actual further processing parameter value are performed by the lithographic processing tool, or wherein measurement of the actual processing parameter value and/or the actual further processing parameter value are measured by a metrology tool separate from the lithographic processing tool.

30. The method of clause 27, wherein the initial processing parameter value at a specific location on the test-substrate results from interpolation of a neighboring initial processing parameter value and/or wherein the initial further processing parameter value at a specific location on the test-substrate results from interpolation of a neighboring initial further processing parameter value, and/or wherein the actual processing parameter at the specific location on the test-substrate results from interpolation of a neighboring actual processing parameter value and/or wherein the actual further processing parameter at the specific location on the test-substrate results from interpolation of a neighboring actual further processing parameter value.

31. The method of any of the clauses 22 to 30, wherein each structure in the plurality of structures comprises a measurement structure for measuring the actual processing parameter value and/or for measuring the actual further processing parameter value.

32. The method of any of the clauses 22 to 31, wherein each structure in the plurality of structures comprises a unique combination of the initial process parameter value and the initial further process parameter value.

33. The method of any of the clauses 22 to 32, wherein the threshold and/or the further threshold is selected from a list comprising: dimension, critical dimension, sidewall angle, image-log-slope, temperature, pattern placement, overlay, resist height, resist loss and defectivity.

34. The method of any of the clauses 22 to 33, wherein the initial processing parameter value set at the lithographic processing tool for processing a current test-substrate is calibrated using the actual processing parameter value measured from a previously processed substrate, and/or wherein the initial further processing parameter value set at the lithographic processing tool for processing the current test-substrate is calibrated using the actual further processing parameter value measured from the previously processed substrate.

35. A computer program product comprising instructions for calibrating the lithographic model according to any of the clauses 22 to 34.

36. A pattern for calibrating the lithographic model configured for simulating at least a part of a lithographic process, the pattern being configured for being processed onto a test-substrate at a plurality of different initial processing parameter values using the lithographic process, the initial processing parameter value being set at the lithographic process for producing the pattern onto the test-substrate, the pattern comprising a structure being configured and constructed for having an output parameter value indicative of the quality of the lithographic process, and the pattern further comprising a measurement structure configured and constructed for determining an actual processing parameter value at which the pattern is processed by the lithographic process.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of determining a process window for a lithographic process configured to process a portion of a design layout onto a substrate, the method comprising:
    determining an output parameter value for each structure of a plurality of structures on the substrate, each output parameter value being associated with a corresponding initial processing parameter value at which the lithographic process is set for producing the structure onto the substrate, the plurality of structures being processed using a range of initial processing parameter values,
    determining, for each structure of the plurality of structures, an actual processing parameter value at which the structure is processed, and
    determining, by a hardware computer system, the process window by replacing the initial processing parameter value by the actual processing parameter value for each of the associated output parameter values and by determining at which actual processing parameter value the output parameter value meets or crosses a threshold.

2. The method of claim 1, wherein the output parameter value determined from the structure includes one or more selected from: dimension, critical dimension, sidewall angle, image log-slope, temperature, pattern placement, overlay, resist height and/or defectivity.

3. The method of claim 1, further comprising:
    associating each output parameter value with a corresponding initial further processing parameter value at which the lithographic process is set for producing the structure onto the substrate, the initial further processing parameter value being a different parameter compared to the initial processing parameter value,
    determining, for each structure of the plurality of structures, an actual further processing parameter value at which the structure is processed, and
    wherein determining the process window further comprises replacing the initial further processing parameter value by the actual further processing parameter value and further comprises determining at which actual further processing parameter value the output parameter value meets or crosses the threshold or a further threshold.

4. The method of claim 3, wherein the initial processing parameter value and the initial further processing parameter value are independent parameter values of the lithographic process.

5. The method of claim 3, wherein each structure of the plurality of structures comprises a unique combination of the initial processing parameter value and the initial further processing parameter value.

6. The method of claim 3, wherein the initial further processing parameter value is a feed forward parameter value set at a lithographic processing tool for performing at least a part of the lithographic process, and wherein the actual further processing parameter value is a measured parameter value comprising an actual measurement performed on the substrate comprising the structures produced using the initial further processing parameter.

7. The method of claim 6, wherein measurement of the actual further processing parameter value is performed by the lithographic processing tool, or wherein measurement of the actual further processing parameter value is measured by a metrology tool separate from the lithographic processing tool.

8. The method of claim 3, wherein at least some structure of the plurality of structures comprises a measurement structure for measuring the actual further processing parameter value.

9. The method of claim 3, wherein the initial further processing parameter value set at the lithographic processing tool for processing the current substrate is calibrated using the actual further processing parameter value measured from the previously processed substrate.

10. The method of claim 1, wherein the initial processing parameter value is one or more selected from: focus, dose, pattern placement, overlay, radiation bandwidth, radiation wavelength, aberrations and/or system dynamics.

11. The method of claim 1, wherein the initial processing parameter value is a feed forward parameter value set at a lithographic processing tool for performing at least a part of the lithographic process, and wherein the actual processing parameter value is a measured parameter value comprising an actual measurement performed on the substrate comprising the structures produced using the initial processing parameter.

12. The method of claim 11, wherein the actual processing parameter value is determined using the actual measurement and/or using logged data resulting from a previous measurement.

13. The method of claim 11, wherein measurement of the actual processing parameter value is performed by the lithographic processing tool, or wherein measurement of the actual processing parameter value is measured by a metrology tool separate from the lithographic processing tool.

14. The method of claim 11, wherein the initial processing parameter value at a specific location on the substrate results from interpolation of a neighboring initial processing parameter value, and/or wherein the actual processing parameter at the specific location on the substrate results from interpolation of a neighboring actual processing parameter value.

15. The method of claim 1, wherein at least some structure of the plurality of structures comprises a measurement structure for measuring the actual processing parameter value.

16. The method of claim 1, wherein the initial processing parameter value set at the lithographic processing tool for processing a current substrate is calibrated using the actual processing parameter value measured from a previously processed substrate.

17. The method of claim 1, further comprising:
determining a trend-line through data points associated with combinations of actual processing parameter values and output parameter values,
determining an offset and/or scaling of individual data points or groups of data-points relative to the trend-line, and
correcting the individual data-points or groups of data-points using the determined offset and/or scaling,
wherein the determining the trend-line, the determining the offset and/or scaling and the correcting are iteratively performed until a termination condition is satisfied.

18. A non-transitory computer program product comprising instructions configured to cause a computer to at least:
determine an output parameter value for each structure of a plurality of structures on a substrate, each output parameter value being associated with a corresponding initial processing parameter value at which a lithographic process is set for producing the structure onto the substrate, the plurality of structures being processed using a range of initial processing parameter values,
determine, for each structure of the plurality of structures, an actual processing parameter value at which the structure is processed, and
determine a process window for the lithographic process by replacing the initial processing parameter value by the actual processing parameter value for each of the associated output parameter values and by determining at which actual processing parameter value the output parameter value meets or crosses a threshold.

19. A method of calibrating a lithographic model configured to simulate at least a part of a lithographic process for processing a portion of a design layout onto a substrate, the method comprising:
determining an output parameter value for each structure of a plurality of structures on a test substrate, the test substrate being processed using the lithographic process and each output parameter value being associated with a corresponding initial processing parameter value at which the lithographic process is set for producing the structure onto the test substrate, the plurality of structures being processed using a range of initial processing parameter values,
determining, for each structure of the plurality of structures, an actual processing parameter value at which the structure is processed, and
calibrating, by a hardware computer system, the lithographic model by replacing the initial processing parameter value by the actual processing parameter value for each of the associated output parameter values, and by adapting a model parameter of the lithographic model based on the actual processing parameter value and the associated output parameter value of at least some structures from the plurality of structures.

20. A non-transitory computer program product comprising instructions configured to cause a computer to at least:
determine an output parameter value for each structure of a plurality of structures on a test substrate, the test substrate being processed using a lithographic process and each output parameter value being associated with a corresponding initial processing parameter value at which the lithographic process is set for producing the structure onto the test substrate, the plurality of structures being processed using a range of initial processing parameter values,
determine, for each structure of the plurality of structures, an actual processing parameter value at which the structure is processed, and
calibrate a lithographic model configured to simulate at least a part of the lithographic process by replacing the initial processing parameter value by the actual processing parameter value for each of the associated output parameter values, and by adapting a model parameter of the lithographic model based on the actual processing parameter value and the associated output parameter value of at least some structures from the plurality of structures.

* * * * *